(12) United States Patent
Baba et al.

(10) Patent No.: US 7,783,452 B2
(45) Date of Patent: Aug. 24, 2010

(54) SIGNAL MEASUREMENT APPARATUS AND TEST APPARATUS (75) Inventors: Tadahiko Baba, Tokyo (JP); Masatoshi Ohashi, Tokyo (JP)

(73) Assignee: Advantest Corporation, Tokyo (JP)

( * ) Notice: Subject to any disclaimer, the term of this patent is extended or adjusted under 35 U.S.C. 154(b) by 315 days.

(21) Appl. No.: 11/941,087

(22) Filed: Nov. 16, 2007

(65) Prior Publication Data
US 2009/0216488 A1 Aug. 27, 2009

Related U.S. Application Data (60) Provisional application No. 60/893,866, filed on Mar. 8, 2007.

(51) Int. Cl.
*G06F 17/18* (2006.01)
(52) U.S. Cl. .......................... 702/180; 702/82; 702/125; 324/765; 714/718; 331/1 A
(58) Field of Classification Search .................. 702/66, 702/71, 82, 125, 69, 117, 180, 179; 324/601, 324/765, 158.1; 714/731, 744, 718, 100, 714/700, 709; 331/100, 1 A
See application file for complete search history.

(56) References Cited

U.S. PATENT DOCUMENTS 6,621,352 B2 *  9/2003  Matsumoto et al. ......... 331/1 A
7,107,166 B2 *  9/2006  Kantake ...................... 702/78
7,126,366 B2 * 10/2006  Ohashi et al. ............... 324/765
7,187,192 B2 *  3/2007  Oshima et al. .............. 324/765
7,421,355 B2 *  9/2008  Hou et al. .................... 702/69
7,570,542 B2 *  8/2009  Lee ........................... 365/233.1

FOREIGN PATENT DOCUMENTS

| JP | 2001-356153 | 12/2001 |
| JP | 2004-125552 | 4/2004 |
| JP | 2004125552 | 4/2004 |
| WO | 03-060533 | 7/2003 |
| WO | 03-104826 | 12/2003 |
| WO | 2005-012930 | 2/2005 |

* cited by examiner

*Primary Examiner*—Carol S Tsai
(74) *Attorney, Agent, or Firm*—Osha Liang LLP (57) ABSTRACT A signal measuring apparatus that measures a first input signal and a second input signal is provided, including a first measuring section that measures the first input signal at a plurality of strobe timings arranged in each cycle of a measurement cycle, a second measuring section that measures the second input signal at a plurality of strobe timings arranged in each cycle of a measurement cycle, a phase difference calculating section that calculates phase differences between the first input signal and the second input signal in each measurement cycle based on measurement results from the first measuring section and the second measuring section, and a distribution generating section that generates distribution information of the phase differences calculated in each measurement cycle by the phase difference calculating section.

12 Claims, 10 Drawing Sheets

SIGNAL MEASUREMENT APPARATUS AND TEST APPARATUS

CROSS REFERENCE TO RELATED APPLICATION

The present application claims priority from a U.S. Provisional Application No. 60/893,866 filed on Mar. 8, 2007, the contents of which are incorporated herein by reference.

BACKGROUND

1. Technical Field

The present invention relates to a signal measuring apparatus and a test apparatus. More particularly, the present invention relates to a measuring apparatus that measures information concerning a distribution of phase differences between a first input signal and a second input signal and to a test apparatus that tests a device under test.

2. Related Art

As a semiconductor circuit, a device such as a DDR-SDRAM or the like that outputs a data strobe signal (DQS) in sync with a data signal (DQ) is known. A rear circuit that receives the data signal can reduce transmission degradation caused by jitter of the data signal by acquiring the data signal with a timing of the data strobe signal.

However, when a phase difference between the data strobe signal and the data signal falls outside a prescribed allowable range, there are cases where the rear circuit cannot correctly acquire the data signal. Therefore, in the testing of such a device, the phase difference between the data strobe signal output by the device under test and the data signal is detected and a judgment is made as to whether the phase difference is within the prescribed allowable range.

For example, the phase difference can be detected by obtaining the difference through measurement of both the phase of the data strobe signal and the phase of the data signal by the measuring apparatus. The phase of each signal can be obtained by sampling the signal at every cycle of the signal with a strobe timing in which a phase is sequentially changed and detecting the strobe timing at which the logic value of the signal changes.

However, the data strobe signal and the data signal each contain jitter, and therefore the phase difference between the signals is not constant. Because of this, in a case where the judgment is made as to whether the phase difference between the data strobe signal and the data signal is within the prescribed allowable range, the measuring apparatus measures the phase difference a plurality of times and makes a judgment as to whether all of the phase differences are within the allowable range.

However, there are cases where sufficient analysis of the phase difference between the data strobe signal and the data signal cannot be achieved by just making a judgment as to whether each of the measured phase differences are within the prescribed allowable range. For example, from the thus achieved judgment result, it is difficult to analyze what type of distribution the phase difference has.

A procedure in which a judgment is made as to whether the plurality of phase differences are within the allowable range is repeated while sequentially changing the allowable range to obtain the distribution of the phase differences. In such a procedure, however, the measurement time becomes remarkably long because the phase differences are measured a plurality of times every time the value of the allowable range is changed.

SUMMARY

Therefore, it is an object of an aspect of the innovations herein to provide a signal measuring apparatus and a test apparatus, which are capable of overcoming the above drawbacks accompanying the related art. The above and other objects can be achieved by combinations described in the independent claims. The dependent claims define further advantageous and exemplary combinations of the innovations herein.

According to a first aspect of the present invention, a signal measuring apparatus that measures a first input signal and a second input signal is provided. The signal measuring apparatus includes a first measuring section that measures the first input signal at a plurality of strobe timings arranged in each cycle of a measurement cycle, a second measuring section that measures the second input signal at a plurality of strobe timings arranged in each cycle of a measurement cycle, a phase difference calculating section that calculates phase differences between the first input signal and the second input signal in each measurement cycle based on measurement results from the first measuring section and the second measuring section, and a distribution generating section that generates distribution information of the phase differences calculated in each measurement cycle by the phase difference calculating section.

According to a second aspect of the present invention, a test apparatus that tests a device under test is provided. The test apparatus includes a signal measuring apparatus that measures a first input signal and a second input signal output by the device under test and a judgment section that makes a judgment concerning pass/fail of the device under test based on a measurement result from the signal measuring apparatus. In the test apparatus, the signal measuring apparatus includes a first measuring section that measures the first input signal at a plurality of strobe timings arranged in each cycle of a measurement cycle, a second measuring section that measures the second input signal at a plurality of strobe timings arranged in each cycle of a measurement cycle, a phase difference calculating section that calculates phase differences between the first input signal and the second input signal in each measurement cycle based on measurement results from the first measuring section and the second measuring section, and a distribution generating section that generates distribution information of the phase differences calculated in each measurement cycle by the phase difference calculating section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
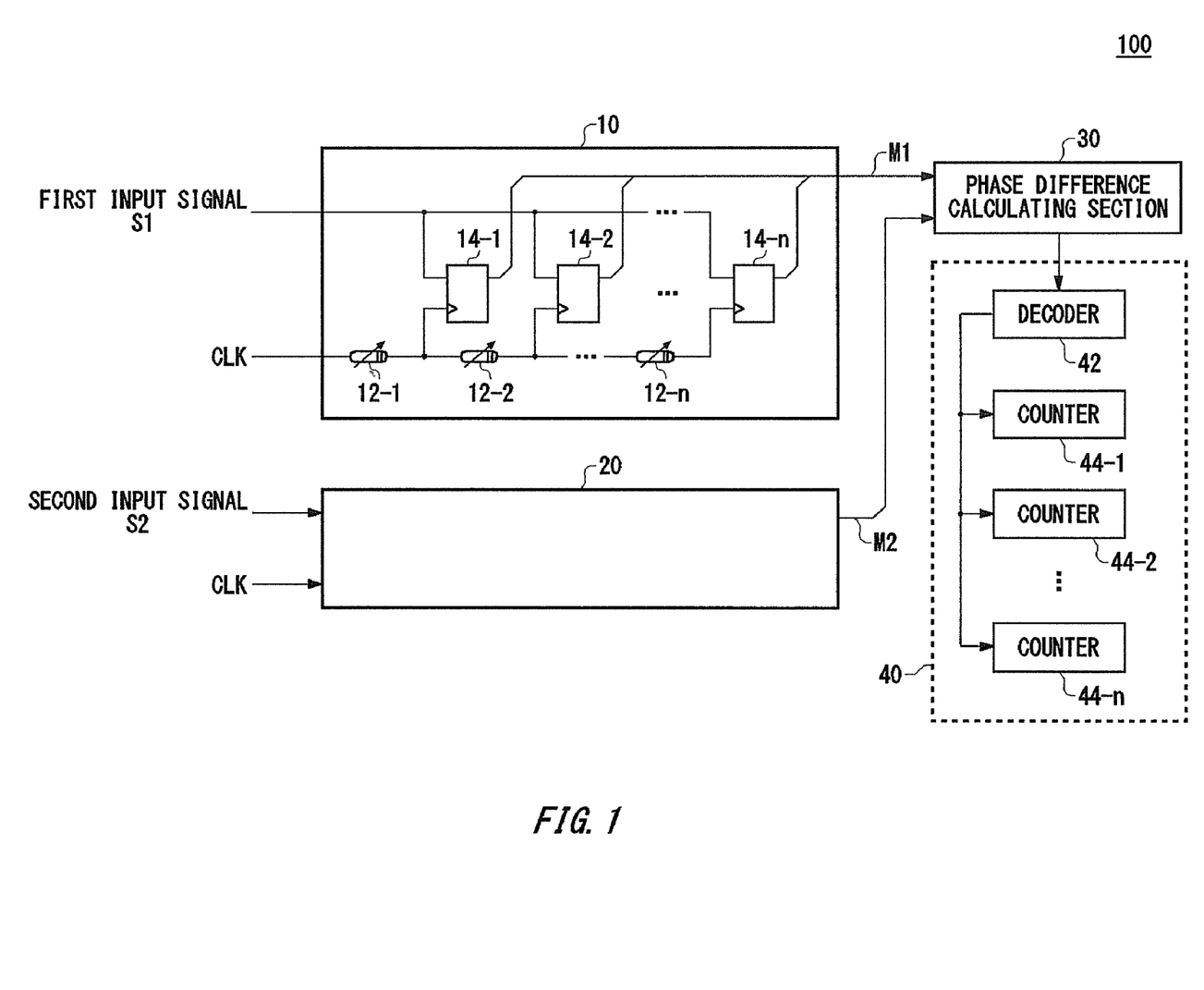
FIG. 1 shows an exemplary configuration of a measuring apparatus 100 according to one embodiment.

FIG. 1 shows an exemplary configuration of a measuring apparatus 100 according to one embodiment. The measuring apparatus 100 measures a distribution of phase differences between a first input signal S1 and a second input signal S2. The first input signal and the second input signal S2 of the present embodiment have substantially the same periods.

The measuring apparatus 100 is provided with a first measuring section 10, a second measuring section 20, a phase difference calculating section 30, and a distribution generating section 40. The first measuring section 10 measures the first input signal S1 at a plurality of strobe timings arranged in each cycle of the measurement cycle. The second measuring section 20 measures the second input signal S2 at a plurality of strobe timings arranged in each cycle of the measurement cycle. In the following, the function and configuration of the first measuring section 10 is described, but the second measuring section 20 has the same function and configuration as the first measuring section 10.

The first measuring section 10 includes a plurality of delay elements 12 (12-1 to 12-n) and a plurality of detectors 14 (14-1 to 14-n). The plurality of delay elements 12 is connected in a cascading manner and sequentially delays a reference clock CLK. The reference clock CLK may have a pulse having a period that is substantially the same as that of the aforementioned measurement cycle.

By extracting the pulse output by each delay element 12, a plurality of strobe timings having different phases can be generated. For example, in a case where a delay amount of each delay element 12 is the same, a plurality of strobe timings arranged isochronally can be achieved.

The plurality of detectors 14 is disposed in a manner to correspond one-to-one with the plurality of delay elements 12. Each detector 14 detects the value of the first input signal S1 at a timing of the pulse of the reference clock CLK output by the corresponding delay element 12. The detectors 14 of the present embodiment are flip-flops that receive the first input signal S1 as data input and receive the signal output by the corresponding delay element 12 as clock input.

Through the configuration described above, the logic value of the first input signal Si can be detected at each strobe timing. Then, by detecting whether the logic value of the first input signal S1 changes at one of the strobe timings, the phase of the first input signal S1 in the cycle can be detected. The first measuring section 10 generates the measurement result M1 of the first input signal S1 for every cycle of the measurement cycle and supplies the measurement result M1 to the phase difference calculating section 30.

The first measuring section 10 may supply to the phase difference calculating section 30 as the measurement result M1 data having n bits in which the logic values detected by each detector 14 are set as the value of each bit. Furthermore, the first measuring section 10 may output the measurement result M1 that indicates, through binary, at what number strobe timing a change in the logic value of the first input signal S1 is detected.

In the same manner, the second measuring section 20 supplies to the phase difference calculating section 30 a measurement result M2 concerning the phase of the second input signal S2. Here, the reference clocks supplied to the first measuring section 10 and the second measuring section 20 have the same phase. Furthermore, the first input signal S1 and the second input signal S2 are supplied in sync to the first measuring section 10 and the second measuring section 20. Through the configuration described above, the phases of the first input signal S1 and the second input signal S2 in each cycle can be simultaneously measured with a single measurement, and therefore the phase difference can be accurately measured.

The phase difference calculating section 30 calculates the phase difference between the first input signal S1 and the second input signal S2 in each measurement cycle based on the measurement results M1, M2 from the first measuring section 10 and the second measuring section 20. For example, the phase difference calculating section 30 sequentially calculates the difference between the measurement result M1 and the measurement result M2 measured in the same cycle for every cycle of the measurement cycle.

The distribution generating section 40 generates information concerning the distribution of the phase differences calculated in each measurement cycle by the phase difference calculating section 30. The distribution information may be information such as a histogram, a standard deviation, a minimum value, a maximum value, an average value, a mode value, or the like. The distribution generating section 40 of the present embodiment generates a histogram that shows an occurrence rate of each value of the phase differences.

The distribution generating section 40 includes a decoder 42 and a plurality of counters 44 (44-1 to 44-n). The decoder 42 decodes phase difference data supplied from the phase difference calculating section 30. For example, in a case where the phase difference calculating section 30 outputs phase difference data that indicates values of the phase differences through binary, the decoder 42 generates decode data in which one bit corresponding to the value of the phase difference data is one and other bits are zero.

The plurality of counters 44 is disposed to correspond to each value of the phase difference data. The plurality of counters 44 in the present embodiment is disposed to correspond one-to-one with the bits of the decode data output by the decoder 42. Each counter 44 can count the number of occurrences of each value of the measured phase difference by counting the number of times the corresponding bit of the decode data is one.

Through the structure described above, the distribution information can be generated in real time from the measurement result in each cycle. Therefore, testing time can be shortened and the phases of the first input signal S1 and the second input signal S2 can be accurately analyzed.

Figure 2:
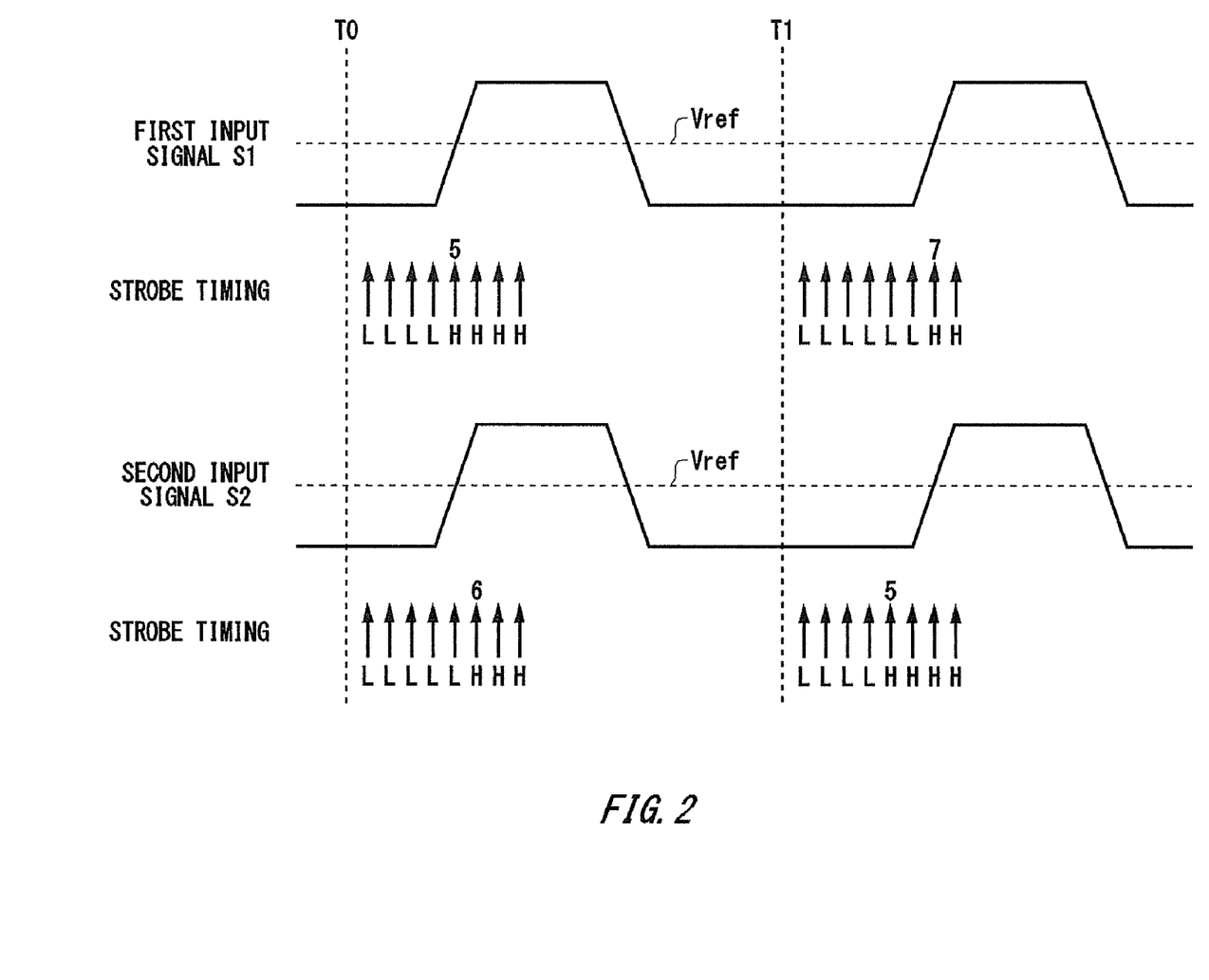
FIG. 2 is a timing chart that shows an exemplary operation of the signal measuring apparatus 100.

FIG. 2 is a timing chart that shows an exemplary operation of the signal measuring apparatus 100. In FIG. 2, T0, T1, . . . represent a beginning of each cycle of the measurement cycle. Vref represents a reference level by which the logic values of the first input signal S1 and the second input signal S2 are judged. The signal measuring apparatus 100 may be supplied with the first input signal S1 and the second input signal S2, which are converted into binary digital signals by comparing the signal level to the reference level.

As described above, the first measuring section 10 and the second measuring section 20 detect the values of the first input signal S1 and the second input signal S2 according to a plurality of strobe timings arranged in a cycle. Furthermore, the first measuring section 10 and the second measuring section 20 output measurement results that indicate at what number strobe timing the change in the value of the input signal is detected in each cycle. For example, in the cycle from T0 to T1, the first measuring section 10 outputs as the measurement result notification that the change is detected at the fifth strobe timing. Furthermore, the second measuring section 20 outputs as the measurement result notification that the change is detected at the sixth strobe timing.

The phase difference calculating section 30 outputs as the phase difference the difference of strobe timing numbers in the measurement results output by the first measuring section 10 and the second measuring section 20. For example, in the cycle from T0 to T1, the phase difference calculating section 30 outputs as the phase difference of the aforementioned cycle the difference "1" of a strobe timing number based on the calculation result of 6−5=1.

Here, it is desirable that the intervals between strobe timings of the first measuring section 10 be substantially equal to the intervals between strobe timings of the second measuring section 20. Furthermore, the intervals between each strobe timing are set to be substantially constant. In other words, identical delay amounts are set for the delay elements 12 of the first measuring section 10 and the second measuring section 20. Therefore, the phase difference between the first input signal S1 and the second input signal S2 can be shown by the strobe timing number described above.

Figure 3:
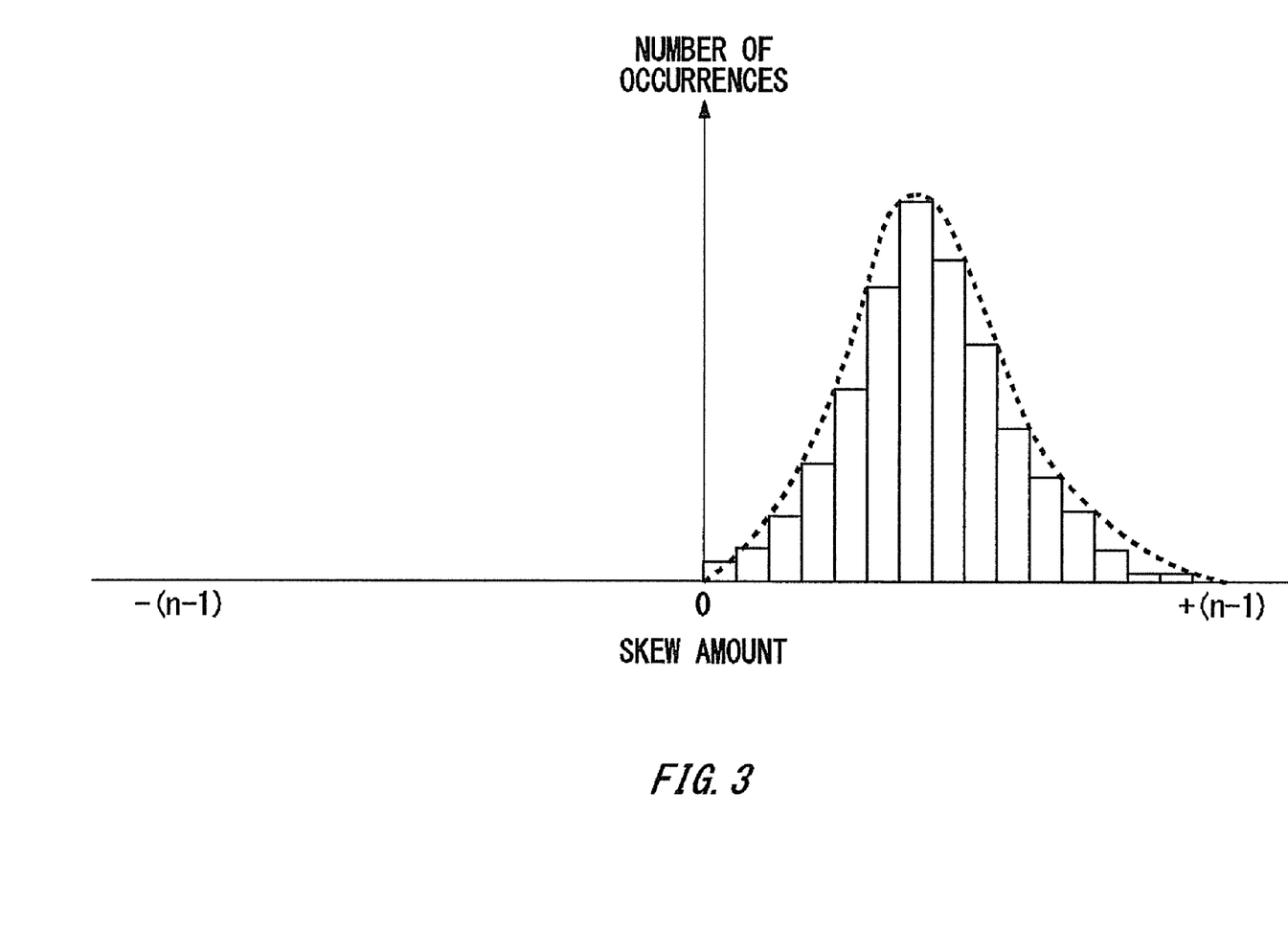
FIG. 3 shows an example of a histogram generated by a distribution generating section 40.

FIG. 3 shows an example of a histogram generated by the distribution generating section 40. In FIG. 3, the horizontal axis represents the phase difference (skew amount) between the first input signal S1 and the second input signal S2 through the difference of the strobe timing numbers. Furthermore, the vertical axis represents the number of occurrences of each phase difference.

The distribution generating section 40 of the present embodiment includes a quantity of counters 44 according to the quantity of strobe timings arranged in one cycle of the measurement cycle. For example, in a case where the first measuring section 10 and the second measuring section 20 each include n detectors 14, the distribution generating section 40 may also include n counters 44. Therefore, each difference value can be counted in a case where the difference of the strobe timing numbers changes from zero to n−1.

Furthermore, in a case where each difference value is counted where the differences of the strobe numbers change from −(n−1) to n−1, the distribution generating section 40 may include 2n−1 counters 44. Through such a configuration, the distribution generating section 40 can easily generate a phase difference histogram.

Figure 4:
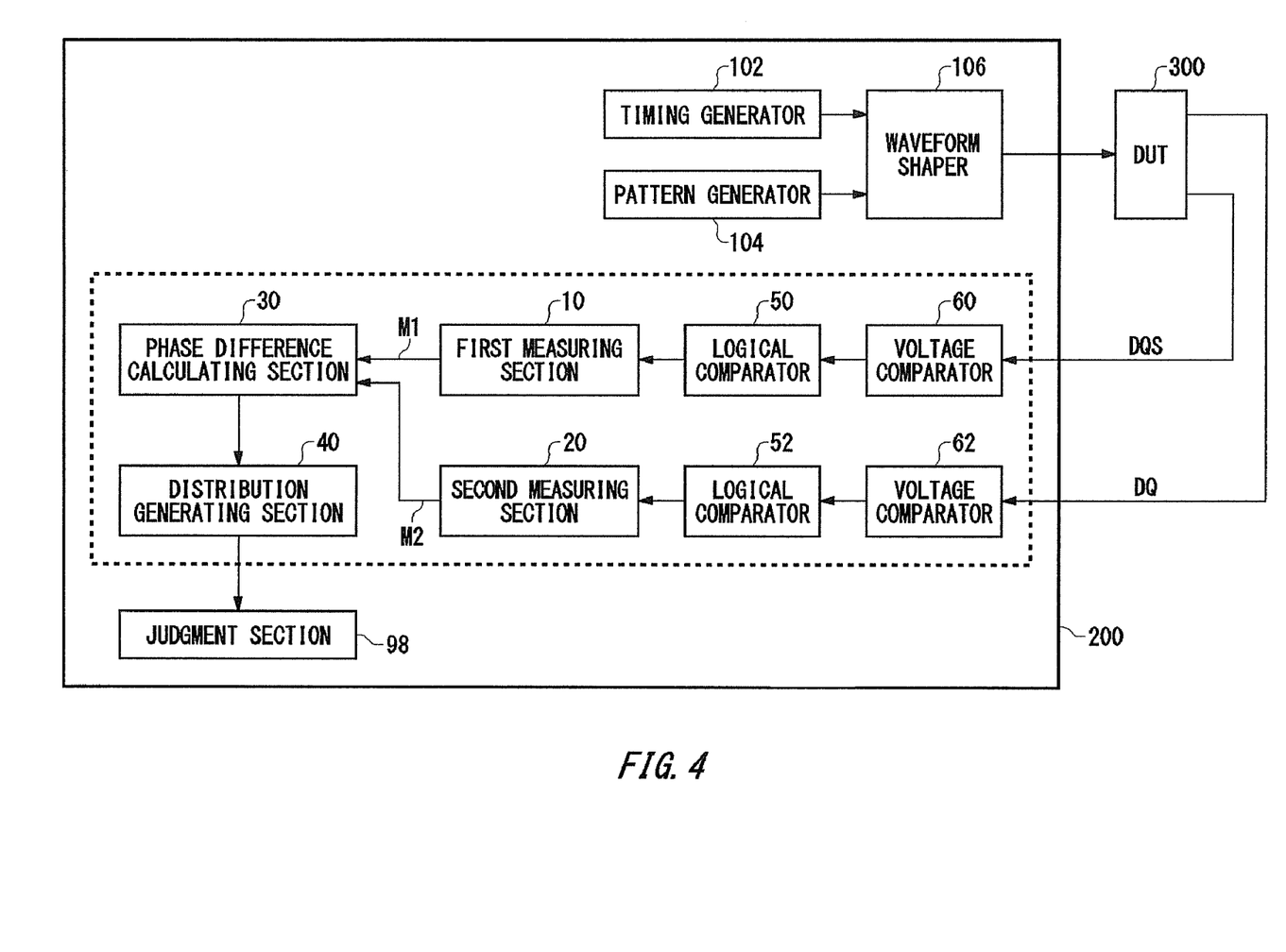
FIG. 4 shows an exemplary configuration of a test apparatus 200 according to another embodiment.

FIG. 4 shows an exemplary configuration of a test apparatus 200 according to another embodiment. The test apparatus 200 is an apparatus that tests a device under test 300, such as a semiconductor circuit or the like, and is provided with a timing generator 102, a pattern generator 104, a waveform shaper 106, the signal measuring apparatus 100, and a judgment section 98.

The timing generator 102, the pattern generator 104, and the waveform shaper 106 generate a test pattern and supply the generated test pattern to the device under test 300. For example, the pattern generator 104 generates a logic pattern to be included in the test pattern. The timing generator 102 generates timing information, such as a bit rate or the like of the test pattern. The waveform shaper 106 shapes the waveform of the test pattern based on the timing information from the timing generator 102 and the logic pattern from the pattern generator 104 and supplies the waveform to the device under test 300.

The device under test 300 operates according to the supplied test pattern to output the data strobe signal DQS and the data signal DQ. The signal measuring apparatus 100 measures the phase difference between the data strobe signal DQS and the data signal DQ output by the device under test 300. In other words, the data strobe signal DQS and the data signal DQ correspond to the first input signal S1 and the second input signal S2 described in relation to FIGS. 1 to 3.

The signal measuring apparatus 100 may have the same function and configuration as the signal measuring apparatus 100 described in relation to FIGS. 1 to 3. The signal measuring apparatus 100 of the present embodiment is further provided with voltage comparators (60, 62) and logical comparators (50, 52) in addition to the configuration of the signal measuring apparatus 100 described in relation to FIGS. 1 to 3.

The voltage comparator 60 outputs a comparison result signal obtained by comparing the signal level of the data strobe signal DQS to a previously set reference level. In the same manner, the voltage comparator 62 outputs a voltage comparison signal obtained by comparing the signal level of the data strobe signal DQ to the previously set reference level. The voltage comparison signal is a signal that indicates through binary a magnitude correlation of the signal level and the reference level.

The logical comparator 50 outputs a logic comparison signal obtained by comparing the logic value of the voltage comparison signal output by the voltage comparator 60 to a set expected value. In the same manner, the logical comparator 52 outputs a logic comparison signal obtained by comparing the logic value of the voltage comparison signal output by the voltage comparator 62 to the set expected value. The expected value is set by the pattern generator 104, for example.

The first measuring section 10 measures the logic comparison signal output by the logical comparator 50. Furthermore, the second measuring section 20 measures the logic comparison signal output by the logical comparator 52. The first measuring section 10, the second measuring section 20, the phase difference calculating section 30, and the distribution generating section 40 are the same as the first measuring section 10, the second measuring section 20, the phase difference calculating section 30, and the distribution generating section 40 described in relation to FIGS. 1 to 3, and therefore a description is omitted.

The judgment section 98 makes a judgment concerning pass/fail of the device under test 300 based on the measurement result from the signal measuring apparatus 100. For example, the judgment section 98 may make a judgment concerning pass/fail of the device under test 300 based on whether the phase difference distribution information measured by the signal measuring apparatus 100 fulfills the specifications of the device under test 300. More specifically, the judgment section 98 may make a judgment concerning pass/fail of the device under test 300 based on the histogram generated by the signal measuring apparatus 100.

Through the test apparatus 200 of the present embodiment, the distribution of phase differences between the DQS and DQ signals can be measured in a short time. Therefore, a source synchronous device under test 300 can be tested in a short time.

Furthermore, a device under test 300 that outputs a differential signal as the data strobe signal DQS is also considered. For such a device under test 300, the test apparatus 200 may measure a distribution of phase differences between cross points of the data strobe signal DQS and edge timings of the data signal DQ.

Figure 5:
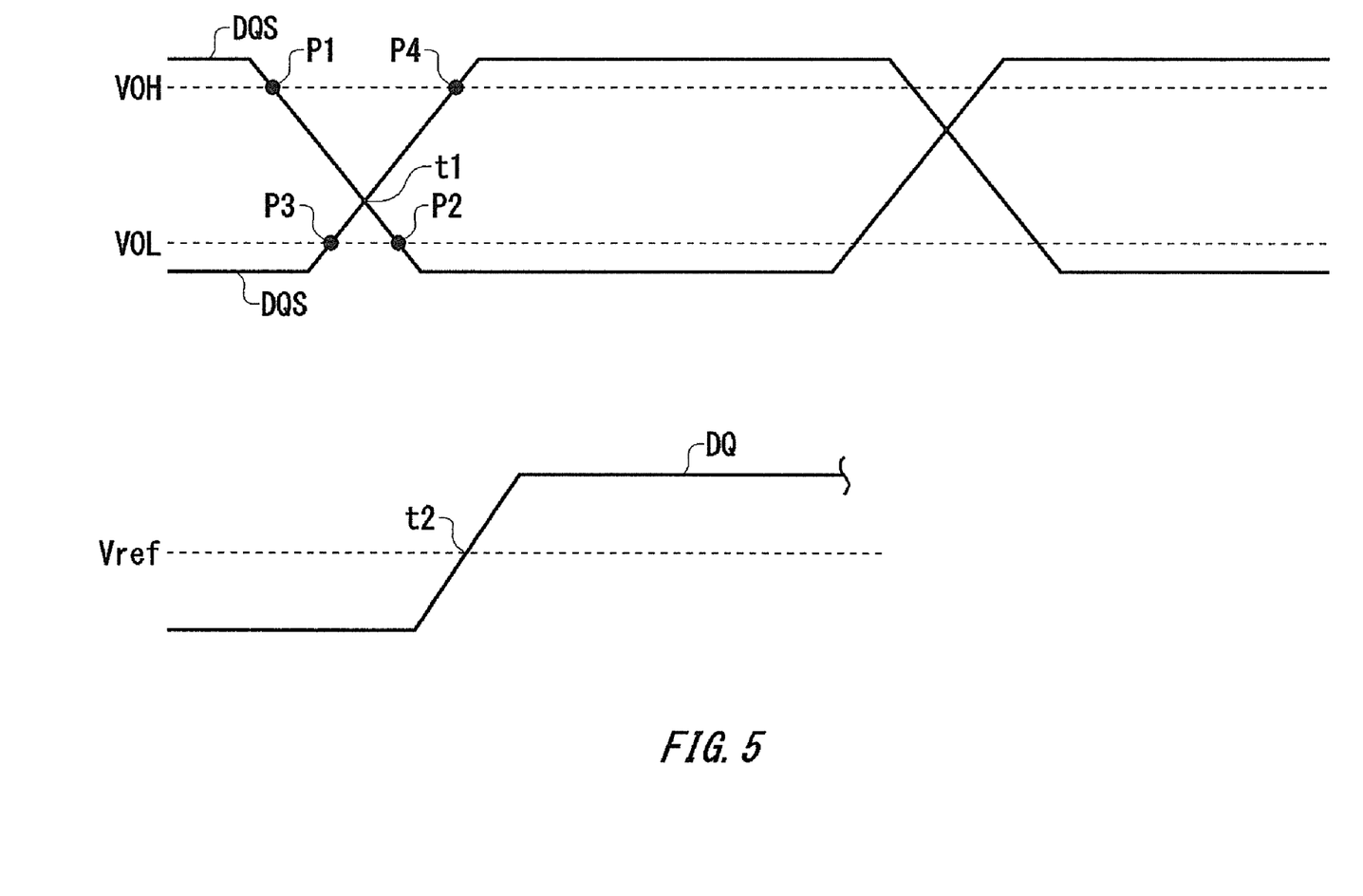
FIG. 5 describes an example of a method for detecting cross points of a differential signal.

FIG. 5 describes an example of a method for detecting cross points of the differential signal. In the present embodiment, as shown in FIG. 5, a case is described in which a timing t1 of a cross point of a non-inverted DQS signal and an inverted /DQS signal is detected.

Because the aforementioned cross point is an intersection of an edge of the DQS signal and an edge of the /DQS signal, the timing t1 can be calculated if coordinates of two points (P1, P2) identifying a straight line of the edge of the DQS signal and two points (P3, P4) identifying straight line of the edge of the /DQS signal are detected. In other words, a formula indicating the edge of the DQS signal is achieved from the coordinates of the two points (P1, P2) on the edge of the DQS signal and a formula indicating the edge of the /DQS signal is achieved from the coordinates of the two points (P3, P4) on the edge of the /DQS signal. From the aforementioned formulas, the timing t1 can be calculated.

The signal measuring apparatus 100 may calculate as the phase difference a difference between the calculated cross point timing t1 and an edge timing t2 of the data signal DQ. The edge timing t2 of the data signal DQ can be measured with the method described in relation to FIGS. 1 to 3.

Figure 6:
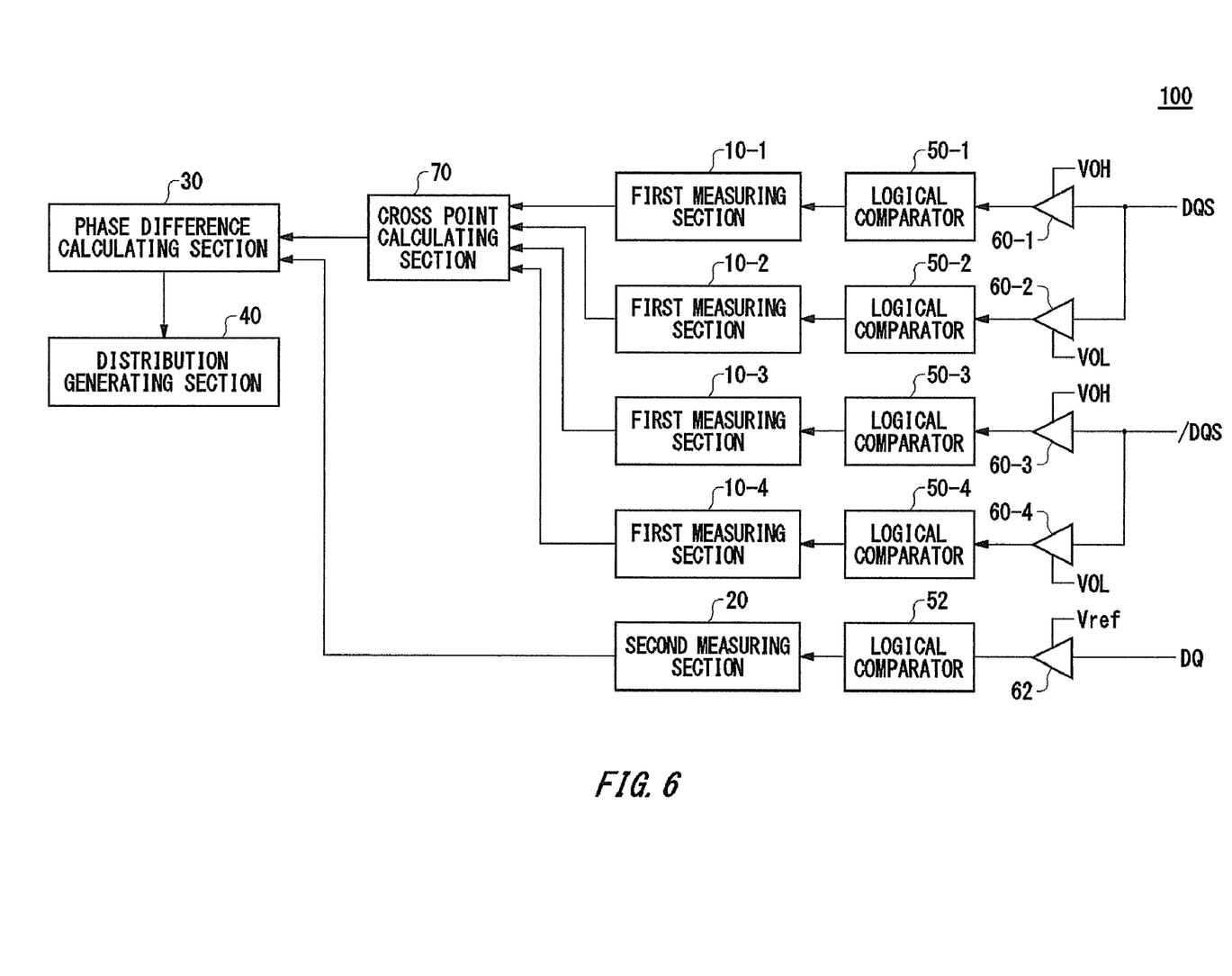
FIG. 6 shows another exemplary configuration of the signal measuring apparatus 100.

FIG. 6 shows another exemplary configuration of the signal measuring apparatus 100. The signal measuring apparatus 100 of the present embodiment measures a distribution of phase differences between cross points of the differential data strobe signals (DQS, /DQS) and edge timings of the data signal DQ.

As described in relation to FIG. 5, the cross point of the differential signals can be obtained from the four points P1 to P4. The signal measuring apparatus 100 of the present embodiment includes four groups that correspond to P1 to P4 and are each made up of the voltage comparator 60, the logical comparator 50, and the first measuring section 10.

The voltage comparator 60-1 is provided with a reference level VOH and compares the reference level VOH to the signal level of the DQS signal. Then, the first measuring section 10-1 detects a timing D1 at which the logic value of the signal output by the voltage comparator 60-1 changes. Therefore, the coordinates of P1 (VOH, D1) can be obtained.

The voltage comparator 60-2 is provided with a reference level VOL and compares the reference level VOL to the signal level of the DQS signal. Then, the first measuring section 10-2 detects a timing D2 at which the logic value of the signal output by the voltage comparator 60-2 changes. Therefore, the coordinates of P2 (VOL, D2) can be obtained.

The coordinates of P3 (VOH, D3) and the coordinates of P4 (VOL, D4) can be obtained for the /DQS signal in the same manner. The cross point calculating section 70 calculates the cross point timing t1 from the timings (D1 to D4) detected by each first measuring section 10 and the reference levels (VOH, VOL) set by each voltage comparator 60. Here, the functions and configurations of the voltage comparator 62, the logical comparator 52, and the second measuring section 20 may be the same as those of the voltage comparator 62, the logical comparator 52, and the second measuring section 20 described in relation to FIG. 4.

The phase difference calculating section 30 calculates the phase difference between the cross point timing t1 calculated by the cross point calculating section 70 and the edge timing t2 detected by the second measuring section 20 for every cycle of the measurement cycle. The distribution generating section 40 generates information concerning the distribution of the phase differences calculated by the phase difference calculating section 30. Through the configuration described above, the distribution of the phase differences between the differential data strobe signal (DQS, /DQS) and the data signal DQ can be easily measured.

Figure 7:
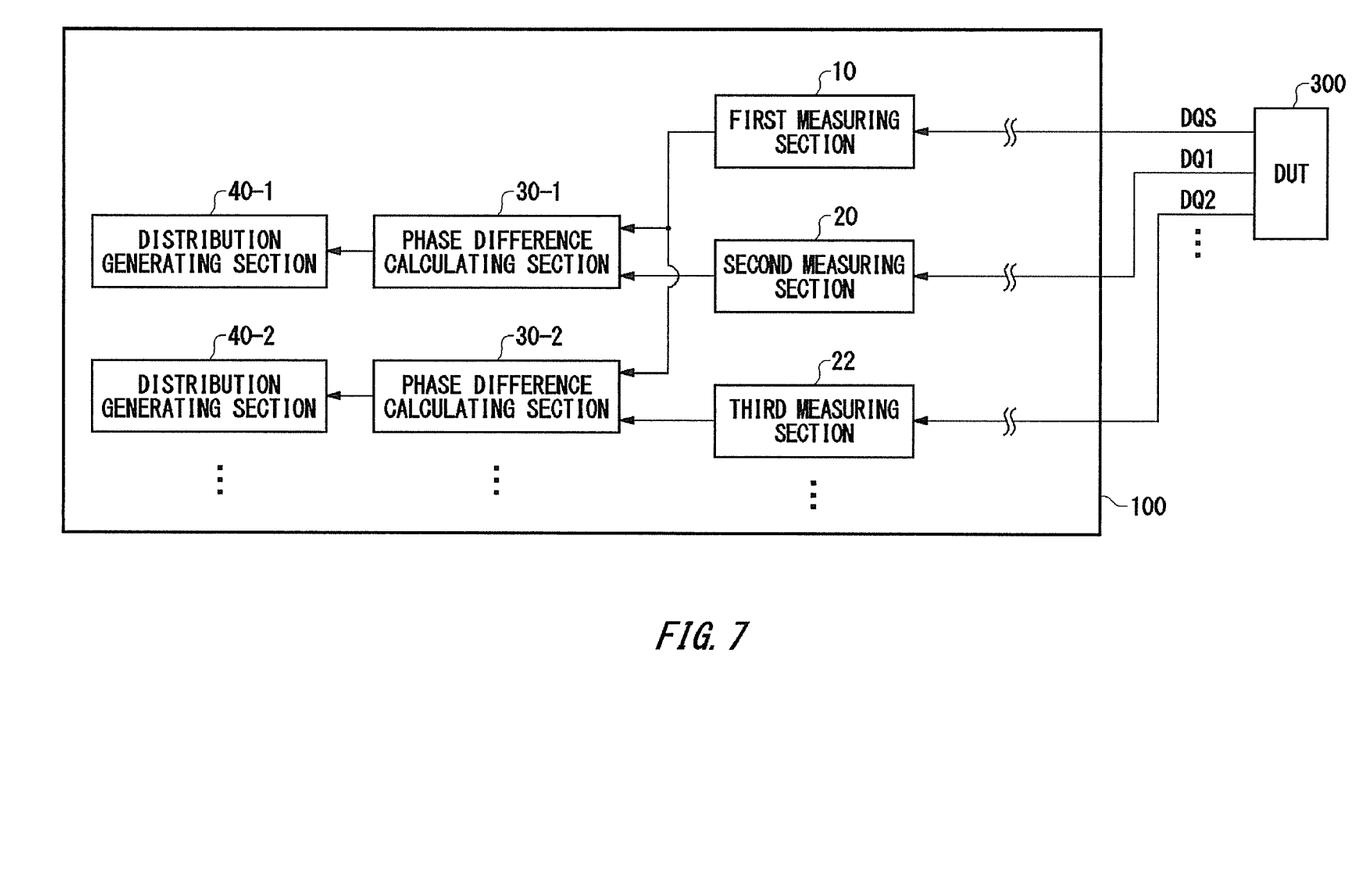
FIG. 7 shows another exemplary configuration of the signal measuring apparatus 100.

FIG. 7 shows another exemplary configuration of the signal measuring apparatus 100. The device under test 300 of the present embodiment outputs a plurality of data signals (DQ1, DQ2, . . . ) in sync with a single data strobe signal DQS. The signal measuring apparatus 100 measures the distribution of phase differences between the data strobe signal DQS and each data signal DQ.

The signal measuring apparatus 100 of the present embodiment is provided with a plurality of judgment sections (first measuring section 10, second measuring section 20, third measuring section 30, . . . ). Furthermore, in the same manner as the signal measuring apparatus 100 shown in FIG. 4, voltage comparators (60, 62) and logical comparators (50, 52) are disposed in front of each judgment section. Furthermore, the signal measuring apparatus 100 of the present embodiment is provided with the phase difference calculating section 30 and the distribution generating section 40 for every data signal to be measured.

In the same manner as the signal measuring apparatus 100 shown in FIG. 4, the first measuring section 10 measures the data strobe signal DQS. The other judgment sections (second measuring section 20, third measuring section 30, . . . ) are disposed to correspond one-to-one with the plurality of data signals (DQ1, DQ2 . . . ) and measure the corresponding data signal DQ. For example, the second measuring section 20 measures the data signal DQ1 and the third measuring section 22 measures the data signal DQ2.

Each phase difference calculating section 30 is disposed to correspond to judgment units other than the first measuring section 10 (second measuring section 20, third measuring section 30, . . . ) and calculates the phase difference between the data strobe signal DQS and the corresponding data signal DQ based on the measurement result from the corresponding judgment section and the measurement result form the first measuring section 10. For example, the phase difference calculating section 30-1 calculates the phase difference between the data strobe signal DQS and the data signal DQ1. Furthermore, the phase difference calculating section 30-2 calculates the phase difference between the data strobe signal DQS and the data signal DQ2.

Each distribution generating section 40 generates information concerning the distribution of the phase differences calculated by the corresponding phase difference calculating section 30. Through the configuration described above, the testing of the device under test 300 that outputs the multi-bit data signal DQ can be performed easily. Furthermore, as described in relation to FIG. 6, the signal measuring apparatus 100 of the present embodiment may have a configuration that can measure the cross point of the differential data strobe signal.

Figure 8:
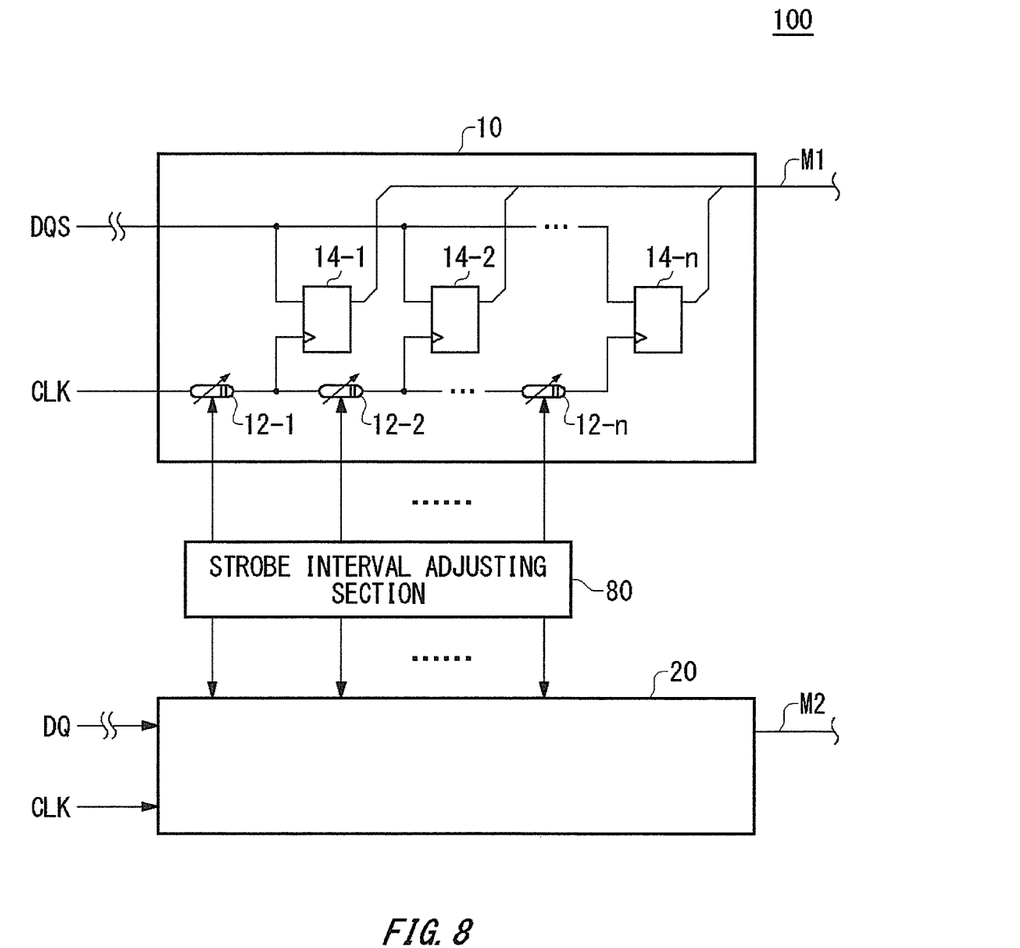
FIG. 8 shows another exemplary configuration of the signal measuring apparatus 100.

FIG. 8 shows another exemplary configuration of the signal measuring apparatus 100. The signal measuring apparatus 100 of the present embodiment is further provided with a strobe interval adjusting section 80 in addition to the configuration of any one of the signal measuring apparatuses 100 described in relation to FIGS. 1 to 7. In FIG. 8, the descriptions of structural components other than the first measuring section 10, the second measuring section 20, and the strobe interval adjusting section 80 are omitted.

The strobe interval adjusting section 80 adjusts the strobe intervals in each judgment section (first measuring section 10, second measuring section 20, third measuring section 22, . . . ). More specifically, the strobe interval adjusting section 80 adjusts the delay amount of each delay element 12 in each judgment section. Through the structure described above, measurement resolution for measuring the phase difference can be adjusted. Here, the strobe interval adjusting section 80 may set the same delay amounts for all delay elements 12 of all judgments sections.

Figure 9:
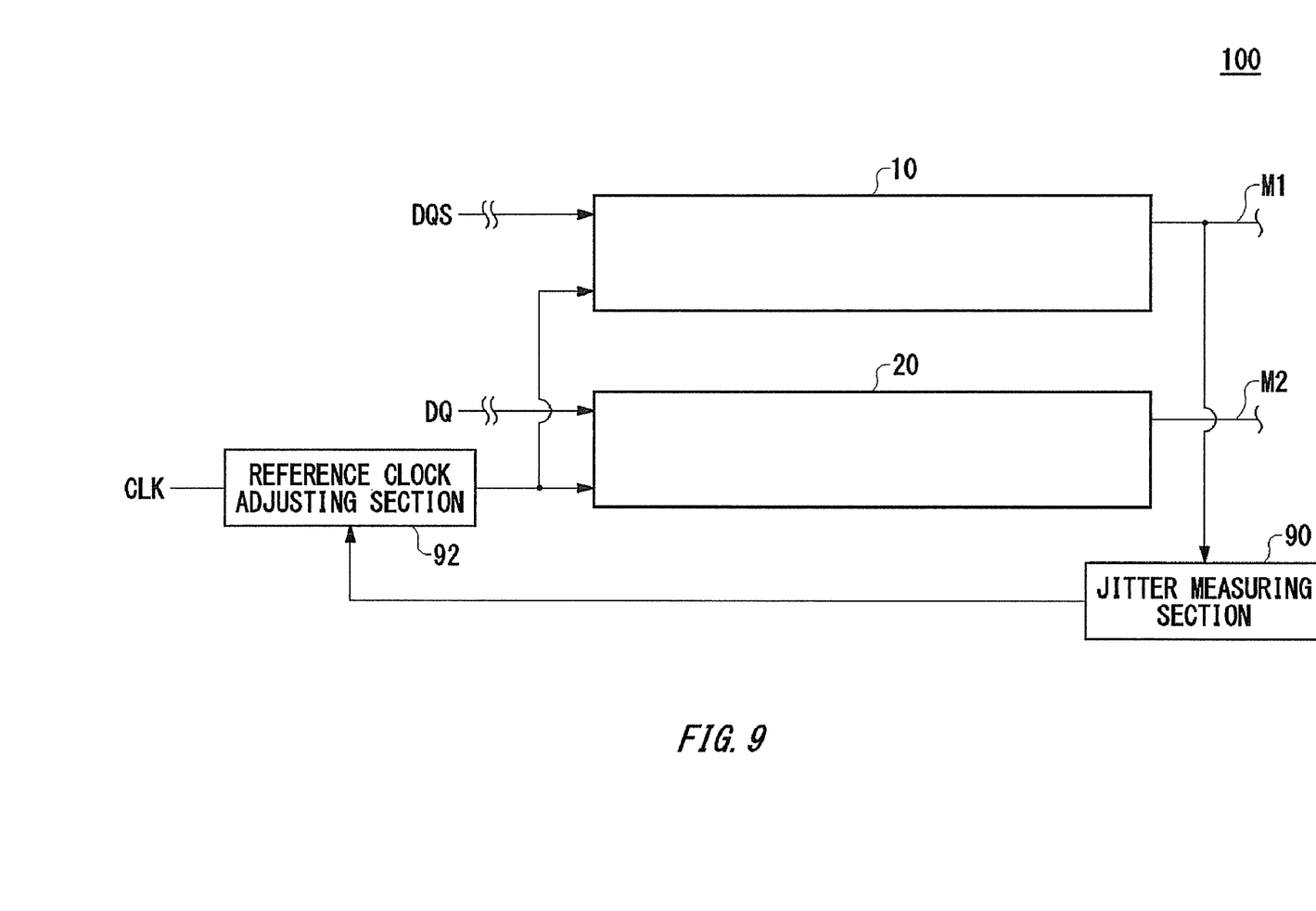
FIG. 9 shows another exemplary configuration of the signal measuring apparatus 100.

FIG. 9 shows another exemplary configuration of the signal measuring apparatus 100. The signal measuring apparatus 100 of the present embodiment is further provided with a jitter measuring section 90 and a reference clock adjusting section 92 in addition to the configuration of any one of the signal measuring apparatuses 100 described in relation to FIGS. 1 to 8. In FIG. 9, the descriptions of structural components other than the first measuring section 10, the second measuring section 20, the jitter measuring section 90, and the reference clock adjusting section 92 are omitted.

The jitter measuring section 90 measures in advance the jitter of the data strobe signal DQS using the first measuring section 10. For example, the jitter measuring section 90 may measure the distribution of the jitter of the data strobe signal DQS based on the phase of the data strobe signal DQS measured by the first measuring section 10.

The reference clock adjusting section 92 adjusts the phases of the plurality of strobe timings by adjusting the phase of the reference clock supplied to the judgment sections (first measuring section 10, second measuring section 20, third measuring section 22, . . . ) based on the jitter measured by the jitter measuring section 90. For example, the reference clock adjusting section 92 may adjust the delay amount of the reference clock.

Figure 10:
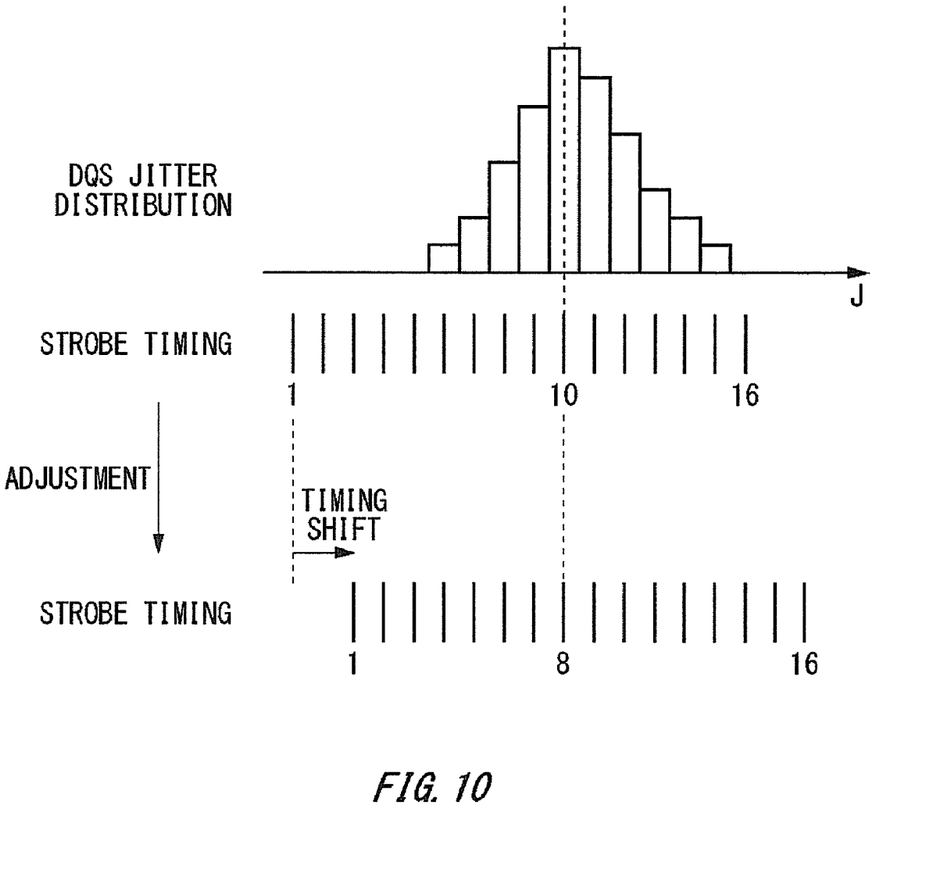
FIG. 10 describes an exemplary operation of the jitter measuring section 90 and the reference clock adjusting section 92.

FIG. 10 describes an exemplary operation of the jitter measuring section 90 and the reference clock adjusting section 92. The jitter measuring section 90 generates a histogram concerning the change timings of the logic value of the data strobe signal DQS detected by the first measuring section 10. For example, in the same manner as the distribution generating section 40, the jitter measuring section 90 may generate the histogram using the plurality of counters. The histogram corresponds to the jitter distribution of the data strobe signal DQS.

As shown in FIG. 10, in a case where the distribution of jitter of the DQS is skewed towards the center of the strobe timing, the measurement range of the phase difference between the DQS and the DQ becomes undesirably small. For example, as shown in FIG. 10, in a case where the distribution of jitter of the DQS is skewed to the right, the phase measurement range of DQ signals having a phase that is delayed in relation to the DQS signal becomes undesirably small.

In response to this, in the signal measuring apparatus 100 of the present embodiment, the reference clock adjusting section 92 adjusts the phase of the reference clock based on the jitter measured by the jitter measuring section 90. For example, as shown in FIG. 10, the reference clock adjusting section 92 may adjust the phase of the strobe timing such that a peak location of the jitter distribution measured by the jitter measuring section 90 matches the central strobe timing.

Through the structure described above, the decrease in the measurement range of the phase difference can be prevented. The signal measuring apparatus 100 may measure the phase difference between the input signals after the adjustment of the reference clock phase described above is performed.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

As made clear from the above description, through embodiments of the present invention, a signal measuring apparatus can be realized that can effectively measure the phase difference between input signals.

What is claimed is:

1. A signal measuring apparatus that measures a first input signal and a second input signal, comprising:
   a first measuring section that measures the first input signal at a plurality of strobe timings arranged in each cycle of a measurement cycle;
   a second measuring section that measures the second input signal at a plurality of strobe timings arranged in each cycle of a measurement cycle;
   a phase difference calculating section that calculates phase differences between the first input signal and the second input signal in each measurement cycle based on measurement results from the first measuring section and the second measuring section; and
   a distribution generating section that generates distribution information of the phase differences calculated in each measurement cycle by the phase difference calculating section;
   wherein
      the distribution generating section generates a histogram that indicates a frequency of occurrence of each value concerning the phase differences calculated by the phase difference calculating section,
      the distribution generating section includes a plurality of counters that are disposed to correspond to each value of the phase differences and count a number of occurrences of the value of the corresponding phase difference,
      the first measuring section outputs a measurement result that indicates at what number strobe timing a change in the value of the first input signal is detected in each cycle,
      the second measuring section outputs measurement result that indicates at what number strobe timing a change in the value of the second input signal is detected in each cycle, and
      the phase difference calculating section outputs as the phase difference the difference between strobe timing numbers in the measurement results output by the first measuring section and the second measuring section.

2. The signal measuring apparatus according to claim 1, wherein the strobe timing of the first measuring section and the strobe timing of the second measuring section have intervals that are substantially the same.

3. The signal measuring apparatus according to claim 2, wherein the distribution generating section includes a quantity of counters according to the quantity of strobe timings arranged in one cycle of the measurement cycle.

4. The signal measuring apparatus according to claim 1, wherein the first input signal is a differential signal, the signal measuring apparatus further comprising a cross point calculating section that calculates a timing of a cross point of the first input signal based on a measurement result from the first measuring section.

5. A test apparatus that tests a device under test, comprising:

the signal measuring apparatus of claim 1 that measures a first input signal and a second input signal output by the device under test; and a judgment section that makes a judgment concerning pass/fail of the device under test based on a measurement result from the signal measuring apparatus.

6. A signal measuring apparatus that measures a first input signal and a second input signal, comprising:

a first measuring section that measures the first input signal at a plurality of strobe timings arranged in each cycle of a measurement cycle;

a second measuring section that measures the second input signal at a plurality of strobe timings arranged in each cycle of a measurement cycle;

a phase difference calculating section that calculates phase differences between the first input signal and the second input signal in each measurement cycle based on measurement results from the first measuring section and the second measuring section; and a distribution generating section that generates distribution information of the phase differences calculated in each measurement cycle by the phase difference calculating section;

wherein the first measuring section and the second measuring section both include:

a plurality of delay elements that are connected in a cascading manner and sequentially delay the reference clock; and a plurality of detectors that are disposed to correspond one-to-one with the plurality of delay elements and detect the phases of the input signals by detecting a value of the input signals at the timing of the reference clock output by the corresponding delay element.

7. The signal measuring apparatus according to claim 6, further comprising a strobe interval adjusting section that adjusts a delay amount of the plurality of delay elements.

8. The signal measuring apparatus according to claim 6, further comprising a reference clock adjusting section that adjusts the phase of the reference clock supplied to the first measuring section and the second measuring section.

9. The signal measuring apparatus according to claim 8, further comprising a jitter measuring section that measures in advance jitter of the first input signal using the first measuring section, wherein the reference clock adjusting section adjusts the phase of the reference clock based on the jitter of the first input signal measured by the jitter measuring section.

10. A test apparatus that tests a device under test, comprising:

the signal measuring apparatus of claim 6 that measures a first input signal and a second input signal output by the device under test; and a judgment section that makes a judgment concerning pass/fail of the device under test based on a measurement result from the signal measuring apparatus.

11. A signal measuring apparatus that measures a first input signal and a second input signal, comprising:

a first measuring section that measures the first input signal at a plurality of strobe timings arranged in each cycle of a measurement cycle;

a second measuring section that measures the second input signal at a plurality of strobe timings arranged in each cycle of a measurement cycle;

a phase difference calculating section that calculates phase differences between the first input signal and the second input signal in each measurement cycle based on measurement results from the first measuring section and the second measuring section;

a distribution generating section that generates distribution information of the phase differences calculated in each measurement cycle by the phase difference calculating section; and a third measuring section that measures a third input signal at a plurality of strobe timings arranged in each cycle of the measurement cycle, wherein the phase difference calculating section calculates the phase difference between the first input signal and the second input signal and the phase difference between the first input signal and the third input signal in each measurement cycle based on the measurement results from the first measuring section, the second measuring section, and the third measuring section.

12. A test apparatus that tests a device under test, comprising:

the signal measuring apparatus of claim 11 that measures a first input signal and a second input signal output by the device under test; and a judgment section that makes a judgment concerning pass/fail of the device under test based on a measurement result from the signal measuring apparatus.

* * * * *